United States Patent [19]

Bittencourt

[11] Patent Number: 4,996,713

[45] Date of Patent: Feb. 26, 1991

[54] ELECTROACOUSTIC PIEZOELECTRIC TRANSDUCER HAVING A BROAD OPERATING RANGE

[75] Inventor: Helio T. Bittencourt, Sao Paulo, Belize

[73] Assignee: S. Eletro-Acustica S.A., Belize

[21] Appl. No.: 411,650

[22] Filed: Sep. 25, 1989

[51] Int. Cl.$^5$ ...................... H04R 17/00; H01L 41/00

[52] U.S. Cl. .................................. 381/190; 381/173; 381/202; 381/204; 310/324; 310/332

[58] Field of Search ............... 381/190, 114, 202, 204, 381/173; 310/324, 332

[56] References Cited

U.S. PATENT DOCUMENTS

| | | | |
|---|---|---|---|
| 2,242,757 | 5/1941 | Romanow | 381/190 |
| 2,270,167 | 1/1942 | Meissner et al. | 381/190 |
| 3,423,543 | 1/1969 | Kompanek | 381/190 |
| 3,588,381 | 6/1971 | Schafft | 381/190 |
| 4,283,605 | 8/1981 | Nakajima | 381/190 |
| 4,401,857 | 8/1983 | Morikawa | 381/190 |
| 4,845,776 | 7/1989 | Bittencourt | 381/190 |

FOREIGN PATENT DOCUMENTS

| | | | |
|---|---|---|---|
| 56-94900 | 7/1981 | Japan | 381/190 |
| 56-169500 | 12/1981 | Japan | 381/190 |
| 58-108897 | 6/1983 | Japan | 381/190 |
| 1-44700 | 2/1989 | Japan | 381/190 |

*Primary Examiner*—Jin F. Ng
*Assistant Examiner*—Jason Chan
*Attorney, Agent, or Firm*—Steinberg & Raskin

[57] ABSTRACT

An electroacoustic piezoelectric transducer comprises a concave diaphragm and at least two planar bimorph elements having different respective resonance frequency characteristics coupled to the diaphragm. The bimorph elements may comprise larger and smaller bimorph elements providing frequency responses in lower and higher frequency ranges respectively, and are preferably directly connected to the inner concave surface of the diaphragm.

10 Claims, 1 Drawing Sheet

FIG.1
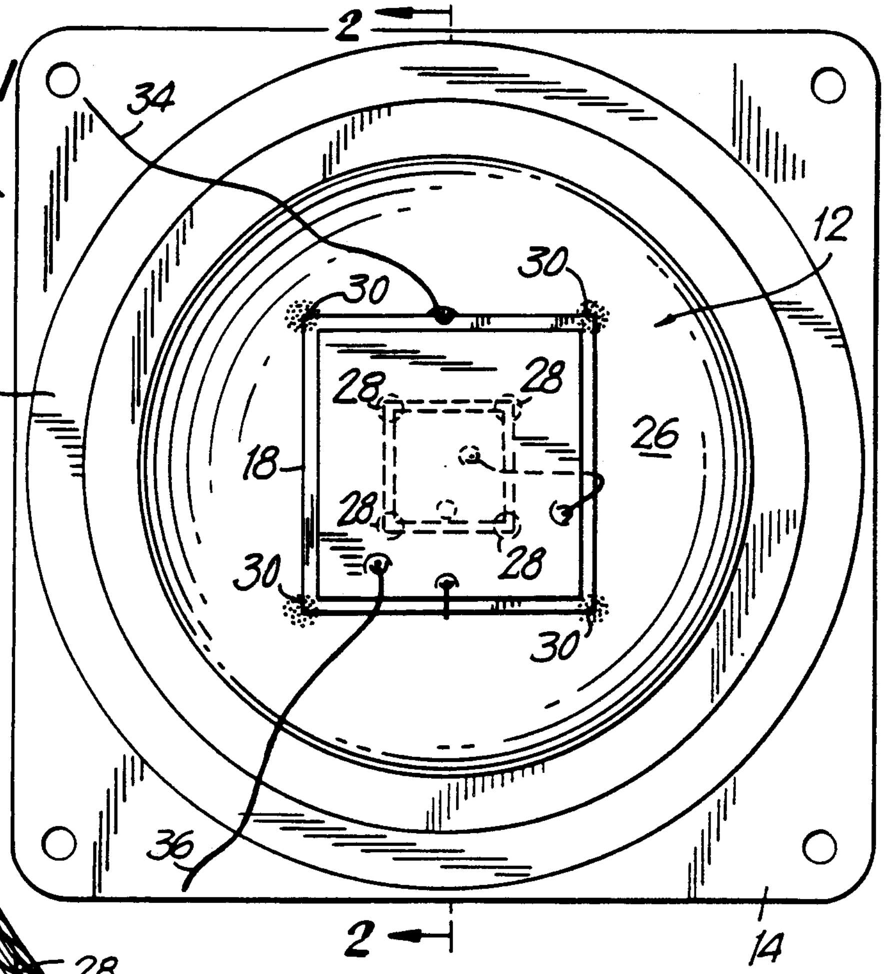
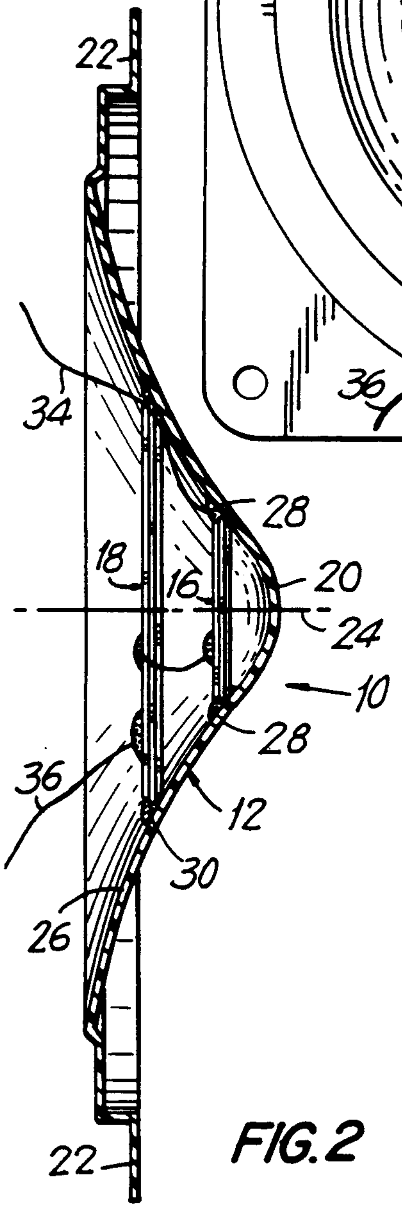
FIG.2
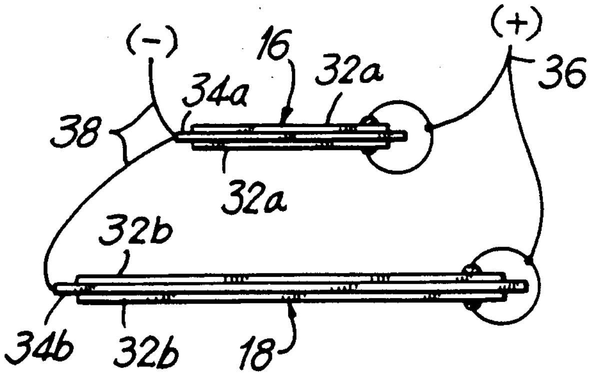
FIG.3

ELECTROACOUSTIC PIEZOELECTRIC TRANSDUCER HAVING A BROAD OPERATING RANGE

BACKGROUND OF THE INVENTION

The present invention relates generally to electroacoustic transducers and, more particularly, to an electroacoustic transducer of the type driven by or driving a piezoelectric element that bends in response to electrical energy applied across it, or which produces electrical energy in response to bending or warping.

Reference is made to the applicant's U.S. Pat. No. 4,845,776 issued July 4, 1989, the disclosure of which is hereby incorporated by reference, with respect to the description therein of such electroacoustic piezoelectric transducers.

A piezoelectric element of the type conventionally used in such electroacoustic transducers is referred to herein as a bimorph element and comprises two piezoelectric wafers having outer electrodes and which are sandwiched over a conductive metallic interlayer which forms an electrode intermediate the two wafers. The bimorph element has a substantially planar configuration and is relatively thin between its outer electrodes with respect to its lateral dimension thereby permitting the bimorph to flex along its long dimensions or diameters. When an electrical signal is positive on the outer electrodes with respect to the intermediate electrode, the center of the bimorph element flexes in one direction. Reversing the electric field polarity causes the bimorph to flex in the opposite direction. Impressing an alternating voltage across the electrodes causes the bimorph element to oscillate.

Electroacoustic piezoelectric transducers are known which convert alternating electric voltage to sound, thereby acting as loudspeakers. In a loudspeaker of this type, a bimorph element is mounted to a concave diaphragm and is electrically coupled to an alternating audio voltage source as described above. As the bimorph element vibrates or oscillates, the diaphragm is caused to vibrate resulting in compressional airwaves transmitting audio vibrations in the usual manner.

The operating range of electroacoustic piezoelectric transducers varies as a function of several variables, including among other things, the physical characteristics of the diaphragm, the arrangement by which the bimorph element is coupled to the diaphragm, and the vibrational characteristics of the particular bimorph element that drives the system (in the case of a loudspeaker). For a particular transducer construction, the frequency response of the transducer depends on the resonance vibration characteristics of the bimorph element. The resonance frequencies of the bimorph element provides an indication of the operating range of a transducer using such an element. Since the bimorph element generally has a high resonance frequency, it is possible to use a large bimorph element for a range of frequencies. Although the frequency response of a transducer can be improved by inserting a coil or inductance in series with the bimorph element and tuning the reactances to the center frequency of the desired bandwidth, the operating range of an electroacoustic piezoelectric transducer is generally limited by the vibrational characteristics of the bimorph element which is coupled to the diaphragm.

SUMMARY OF THE INVENTION

It is therefore an object of the present invention to provide new and improved electroacoustic piezoelectric transducers in which piezoelectric elements which bend in response to electrical energy, or which produce electrical energy in response to bending, are coupled to diaphragms.

Another object of the present invention is to provide new and improved electroacoustic piezoelectric transducers having broad operating ranges and improved frequency response.

In accordance with the present invention, these and other objects are attained by providing an electroacoustic piezoelectric transducer including a concave diaphragm having a central apex and an outer peripheral region about which the diaphragm can be mounted on a housing, and at least two bimorph elements having different respective resonance frequency characteristics coupled to the diaphragm, and electric circuit means for coupling the electrodes of the bimorph elements to a voltage source.

The bimorph elements are preferably mounted directly to the inner concave surface of the diaphragm and extend substantially transversely to an axis that passes through the apex of the diaphragm along which vibrations occur when sound waves are produced or received.

The bimorph elements preferably are polygonal and are directly secured to the inner concave surface of the diaphragm at their corners, with one of the bimorph elements being situated closer to the apex of the diaphragm than another one of the bimorph elements. The corners of each of the bimorph elements may be advantageously situated in substantially the same orientation as, and in substantial alignment with, the corners of other ones of the bimorph elements with respect to the diaphragm axis.

When the electroacoustic piezoelectric transducer of the invention is used as a loudspeaker, the electric circuit means couple the outer and inner electrodes of the plurality of bimorph elements to a common voltage source.

In this manner, the band of frequencies over which the transducer operates is expanded relative to the operating range of conventional transducers which utilize only a single bimorph element. For example, in a case where two bimorph elements having different respective frequency characteristics are used, one of the bimorph elements will provide good frequency response over a range of lower frequencies, while the other bimorph element provides good frequency response over a range of higher frequencies.

Other features and advantages of the invention will become apparent from the following description.

DESCRIPTION OF THE DRAWINGS

A more complete appreciation of the present invention and many of the attendant advantages thereof will be readily understood by reference to the following detailed description when considered in connection with the accompanying drawings, illustrating a preferred embodiment, and in which:

FIG. 1 is a plan view of a electroacoustic piezoelectric transducer constructed in accordance with the present invention;

FIG. 2 is a section view taken along line 2—2 of FIG. 1; and

FIG. 3 is a schematic illustration showing electrical circuit means coupled to the bimorph elements of the electroacoustic piezoelectric transducer shown in FIGS. 1 and 2.

DETAILED DESCRIPTION OF THE PREFERRED EMBODIMENT

Referring now to the drawings wherein like reference characters designate identical or corresponding parts throughout the several views, and more particularly to FIGS. 1 and 2, an electroacoustic piezoelectric transducer 10 in accordance with the invention is illustrated. Transducer 10 comprises a substantially conical compliant diaphragm 12 mounted on a housing 14 (FIG. 1) and a pair of bimorph elements 16 and 18 coupled to the diaphragm 12.

Diaphragm 12 has a rearward substantially central apex 20 and a forward outer peripheral region 22 along which the diaphragm 12 is mounted on housing 14. The diaphragm 12 has an axis 24 (FIG. 2) that extends through the apex 20 along which vibrations occur when the diaphragm is producing or receiving sound waves.

In accordance with the invention, bimorph elements 16 and 18 which are connected to the diaphragm 12 in a manner described below have different respective resonance frequency characteristics. For example, the smaller bimorph 16 may have a fundamental resonance frequency of 20 kilohertz while the larger bimorph element 18 may have a fundamental resonance frequency of about 2 kilohertz.

Each of the bimorph elements 16 and 18 has a square configuration and is directly connected to diaphragm 12 by securing each of its four corners to the inner concave surface 26 of diaphragm, such as by means of epoxy adhesive or enamel. The corners 28 of bimorph element 16 are secured to the inner surface 26 of diaphragm 12 at locations substantially symmetrical with respect to the axis 24. Similarly, the corners 30 of bimorph element 18 are secured to the inner diaphragm surface 26 substantially symmetrically with respect to axis 24 so that the planar bimorph elements 16 and 18 are substantially parallel to each other. Moreover, the corners 28 and 30 of bimorph elements 16 and 18 are secured to the inner diaphragm surface 26 in substantially the same orientation with respect to the axis 24 so that the corners of the respective bimorph elements are in substantial alignment with each other. This arrangement permits the diaphragm to be driven (in the case of a loudspeaker) in a manner which accurately approaches a desirable piston-like movement.

Referring to FIG. 3, each of the bimorph elements 16 and 18 comprises a respective pair of piezoelectric wafers 32*a*,32*a*; 32*b*,32*b* on which outer layers of conductive material, such as nickel, are deposited to function as outer electrodes. The piezoelectric wafers 32 are sandwiched over respective conductive metallic interlayers 34*a*, 34*b* of bimorph elements 16 and 18 which form intermediate electrodes of the bimorph elements 16 and 18. The bimorph elements 16 and 18 are of the "bender" type in which in-phase vibrational displacements of the corner regions of each bimorph element occur upon the electrodes of the bimorph element being coupled to an alternating voltage source.

Electric circuit means are provided for coupling the outer and inner electrodes of the bimorph elements to a common voltage source. Still referring to FIG. 3, the circuit means include conductor 36 for coupling the outer electrodes of the piezoelectric wafers 32 of bimorph elements 16 and 18 to a positive terminal of a voltage source and conductor 38 for coupling the intermediate electrodes 34 of bimorph elements 16 and 18 to the negative terminal of the voltage source.

When the diaphragm 12 is driven by impressing an alternating voltage across conductors 36 and 38, an improved frequency response extending over an operating range that is significantly broader relative to an operating range of a conventional transducer incorporating a single piezoelectric bimorph element is obtained. For example, the electroacoustic piezoelectric transducer may operate over a broad band of frequencies from 1.5 to 40 kilohertz. The smaller bimorph element 16 will have good frequency response in a high band of frequencies while the larger bimorph element 18 will provide good frequency response in a lower band of frequencies. When the electroacoustic piezoelectric transducer is used as a loudspeaker, good frequency response is thereby obtained over a broad range of frequencies not possible heretofore. Bimorph elements having different resonance frequency characteristics are simply designed by varying the dimensions of the bimorph elements, and generally, larger bimorph elements have good frequency response over lower frequency ranges while smaller bimorph elements provide good frequency response in higher frequency ranges. Such different-size bimorph elements are easily directly connected to the diaphragm of a transducer by securing their exterior edges, such as their corners in the case of polygonal-shaped bimorph elements, to the inner concave surface of the diaphragm as described above. In this case, the smaller bimorph element is located closer to the apex of the diaphragm as clearly seen in FIG. 2. This arrangement also enhances the piston-like drive mode for the transducer.

It will be understood that transducers in accordance with the invention can vary from the one shown and described herein. For example, the planar bimorph elements need not be square or even polygonal, but may have a circular wafer-type configuration, in which case the entire external edge of each bimorph element may be secured to the inner surface of the diaphragm. More than two bimorph elements having different resonance frequency characteristics may be coupled to a diaphragm as desired.

Obviously, numerous other modifications and variations of the present invention are possible in the light of the above teachings. It is therefore to be understood that within the scope of the claims appended hereto, the invention may be practiced otherwise than as specifically disclosed herein.

What is claimed is:

1. An electroacoustic transducer, comprising:

a concave diaphragm having a central apex and an outer peripheral region about which said concave diaphragm can be mounted on a housing, said concave diaphragm having an inner concave surface between said central apex and said outer peripheral region defining an interior space within said concave diaphragm;

at least two differently-sized planar bimorph elements having exterior edges, said planar bimorph elements being secured at said exterior edges thereof directly to said inner concave surface of said concave diaphragm within said interior space, a smaller one of said planar bimorph elements being situated closer to said concave diaphragm central apex than a larger one of said planar bimorph elements, said planar bimorph elements being of the type wherein in-phase vibrational displacements occur upon application of an alternating voltage thereto; and electric circuit means for coupling electrodes of said planar bimorph elements to a voltage source.

2. The transducer of claim 1 wherein each of said planar bimorph elements has a polygonal shape defining a plurality of corners, said corners and only said corners of said planar bimorph elements being rigidly secured directly to said inner concave surface of said concave diaphragm.

3. The transducer of claim 2 wherein said corners of said planar bimorph elements are rigidly secured to said inner concave surface of said concave diaphragm substantially symmetrically with respect to a central axis passing through said central apex of said concave diaphragm.

4. The transducer of claim 2 wherein each of said planar bimorph elements has a substantially square configuration with four corners, and wherein said four corners of each of said planar bimorph elements are directly secured to said inner surface of said concave diaphragm at locations substantially symmetrical with respect to a central axis passing through said central apex.

5. The transducer of claim 2 wherein said corners of each of said planar bimorph elements are rigidly secured to said inner concave surface of said concave diaphragm in substantially the same orientation as, and in substantial alignment with, said corners of the other ones of said planar bimorph elements with respect to a central axis of said concave diaphragm.

6. An electroacoustic transducer, comprising:

a concave diaphragm having a substantially central apex through which an axis extends along which vibrations occur when producing or receiving soundwaves, and an outer peripheral region about which said concave diaphragm can be mounted on a housing;

at least two planar bimorph elements having different respective resonance frequency characteristics, each of said planar bimorph elements being directly connected to said concave diaphragm; and electric circuit means for coupling electrodes of said planar bimorph elements to a voltage source.

7. The transducer of claim 6 wherein said planar bimorph elements extend transversely to, and are substantially symmetrical with respect to, said axis of said concave diaphragm.

8. The transducer of claim 6 wherein said planar bimorph elements are each substantially symmetrical and polygonal having a plurality of corners, said corners of said planar bimorph elements being secured directly to said inner concave surface of said concave diaphragm, said planar bimorph elements extending substantially transversely to, and being substantially symmetrical with respect to, said concave diaphragm axis, a first one of said planar bimorph elements being situated closer to said central apex than a second one of said planar bimorph elements.

9. The transducer of claim 6 wherein said electric circuit means constitutes means for coupling outer and inner electrodes of said planar bimorph elements to a common voltage source.

10. The transducer of claim 6 wherein said planar bimorph elements have respective exterior edges and are connected to said inner concave surface of said concave diaphragm along said exterior edges thereof.

* * * * *